(12) United States Patent
Cho

(10) Patent No.: US 6,456,558 B1
(45) Date of Patent: Sep. 24, 2002

(54) COLUMN DECODING APPARATUS FOR USE IN A SEMICONDUCTOR MEMORY DEVICE

(75) Inventor: Ho-Youb Cho, Ichon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/895,882

(22) Filed: Jun. 29, 2001

(30) Foreign Application Priority Data

Jun. 30, 2000 (KR) ........................................ 2000-37321

(51) Int. Cl.[7] ................................................ G11C 8/00
(52) U.S. Cl. ............................ 365/230.06; 365/230.06; 365/189.08
(58) Field of Search ...................... 365/230.03, 230.06, 365/189.08, 205, 207, 208

(56) References Cited

U.S. PATENT DOCUMENTS

| | | | | |
|---|---|---|---|---|
| 4,926,384 A | * | 5/1990 | Roy ........................ | 365/230.03 |
| 5,499,218 A | * | 3/1996 | Ahn et al. .............. | 365/230.06 |
| 5,650,977 A | * | 7/1997 | Kyung et al. .......... | 365/230.06 |
| 5,923,607 A | * | 7/1999 | Suh ........................ | 365/230.03 |
| 6,327,215 B1 | * | 12/2001 | Ternullo, Jr. et al. ... | 365/230.06 |

\* cited by examiner

*Primary Examiner*—Trong Phan
(74) *Attorney, Agent, or Firm*—Townsend and Townsend and Crew LLP

(57) ABSTRACT

A column decoding apparatus in a semiconductor memory device of the present invention is capable of improving the rise/fall time of a column selecting signal by reducing the number of load transistors of the column decoder by enabling the column selecting signal of a selected block. In a semiconductor memory device that has a plurality of memory cell arrays, bit line sense amplifier arrays and block controlling units, a column decoder, and column selecting transistors formed between the plurality of bit line sense amplifier arrays and a data line, a column decoding apparatus of the present invention includes column selecting signal generating units, each of which receives a control signal of the block controlling units and the output signal of the column decoder for generating a column selecting signal activated only within a selected block to drive the column selecting transistors.

6 Claims, 7 Drawing Sheets

US 6,456,558 B1

COLUMN DECODING APPARATUS FOR USE IN A SEMICONDUCTOR MEMORY DEVICE

CROSS REFERENCES TO RELATED APPLICATIONS

This application claims priority from Korean Application entitled "Column Decoding Apparatus for Use in a Semiconductor Memory Device", Application No. 2000-37321, filed on Jun. 30, 2000 and incorporates by references its disclosure for all purposes.

BACKGROUND OF THE INVENTION

1. Field of the Invention

The present invention relates to a column decoding apparatus in a semiconductor memory device, and, more particularly, to a column decoding apparatus enabling a column selecting signal only within a selected block.

2. Prior Art of the Invention

FIG. 1 is a diagram showing the configuration of a typical memory cell array of a semiconductor memory device, and FIG. 2 is a diagram of a conventional column decoding apparatus.

The semiconductor memory device shown in FIG. 1 comprises a plurality, e.g., 16 or 32, of memory cell array blocks; a plurality of block controlling units, each for selecting a corresponding one of the memory cell array blocks;, a plurality of bit line sense amplifier (BLSA) arrays, each for reading/writing of the memory cell; and a column decoder (Y-DEC).

FIG. 2 is a block diagram of a conventional column decoding apparatus of the device of FIG. 1. FIG. 2 shows the output of the column decoder (Y-DEC) as a column selecting signal (YI). Since YI is connected to the column selecting transistors (i.e., driving transistors) for all the blocks, the transistor load of the column decoder is very large (i.e. "heavy").

FIG. 3 shows a timing diagram of the conventional column decoding apparatus of FIG. 2. When, for example, there are 16 memory cell array blocks, the transistor load of one column selecting signal YI is 68 (4 column selecting transistors×17 BLSA array). Therefore, the rise time/fall time of the column selecting signal increases to detrimentally increase memory access time. In addition, because column selecting signal YI operates as a pulse, the column selecting signal YI in a memory, which operates in high frequency range, is degraded so that reading/writing in the memory cannot be accurately executed.

SUMMARY OF THE INVENTION

The present invention provides, in a semiconductor memory device, a column decoding apparatus capable of improving the rise/fall time of a column selecting signal by reducing the transistor load associated with the column decoder by enabling the column selecting signal of a selected block.

In accordance with one aspect of the present invention, there is provided, in a semiconductor memory device having a plurality of memory cell arrays, bit line sense amplifier arrays and block controlling units, a column decoder and column selecting transistors formed between the plurality of bit line sense amplifier arrays, and a data line. The column decoding apparatus comprising: column selecting signal generating units, each receiving a control signal from the block controlling units and an output signal from the column decoder for generating a column selecting signal activated only within a selected block, to drive the column selecting transistors.

BRIEF DESCRIPTION OF THE DRAWINGS

The above and other features of the present invention will become apparent from the following description of specific embodiments taken in conjunction with the accompanying drawings, in which.

DESCRIPTION OF SPECIFIC EMBODIMENTS

Hereinafter, preferred embodiments of the present invention will be described in detail with reference to the accompanying drawings.

As in a conventional semiconductor memory device, a semiconductor memory device of the present invention comprises a plurality of memory cell array blocks, bit line sense amplifier (BLSA) arrays for reading/writing memory cells, a block controlling unit for selecting one of the memory cell blocks, and a column decoder Y-DEC for selecting a column cell by decoding a column address.

Figure 1:
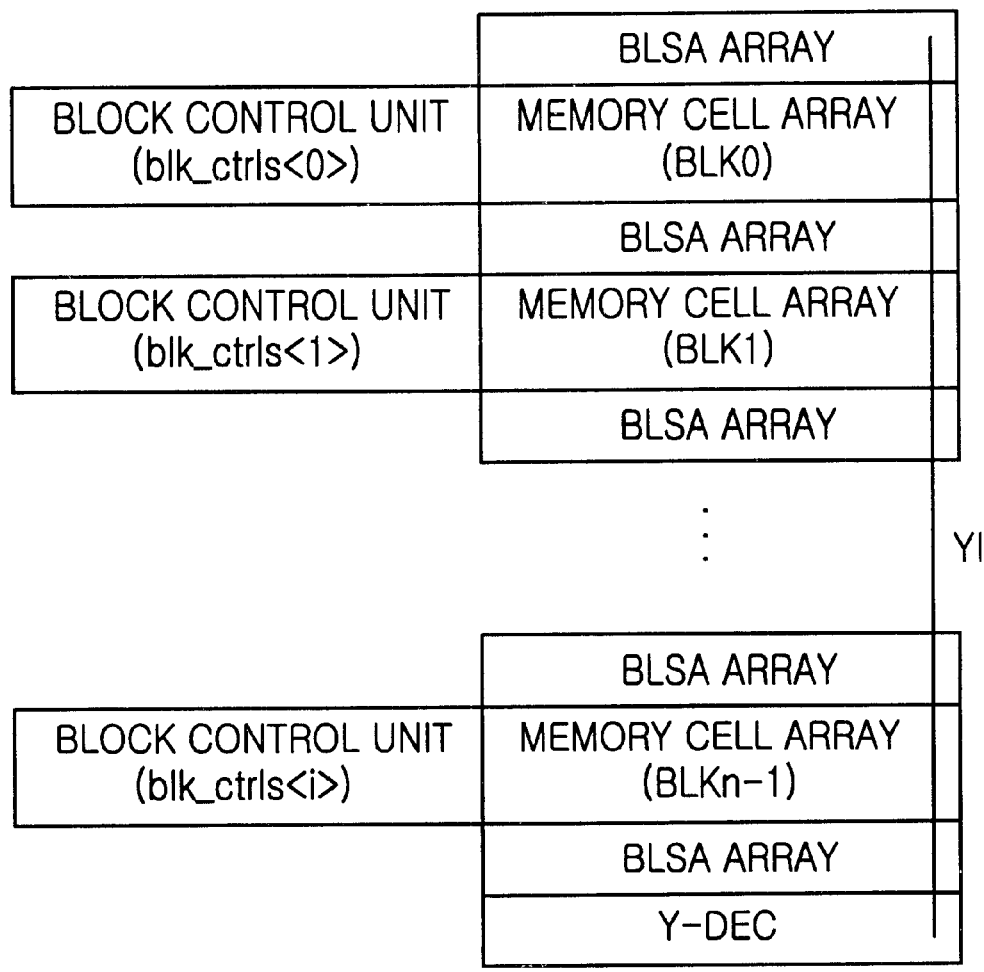
FIG. 1 is a block diagram showing the configuration of a typical memory cell array of a semiconductor memory device.
Figure 2:
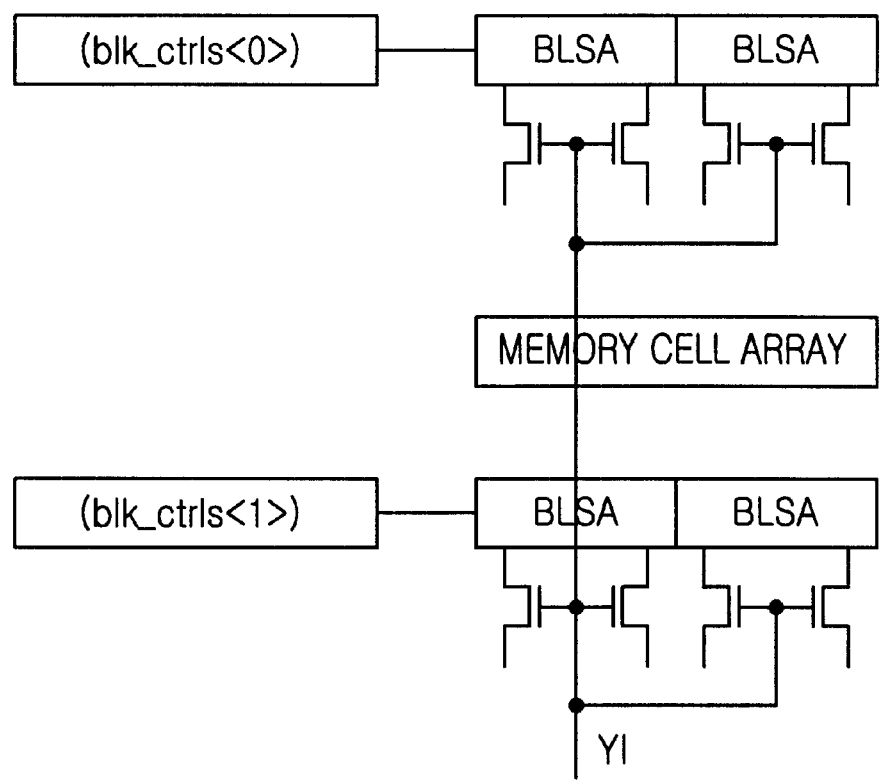
FIG. 2 is a block diagram of a conventional column decoding apparatus.
Figure 3:
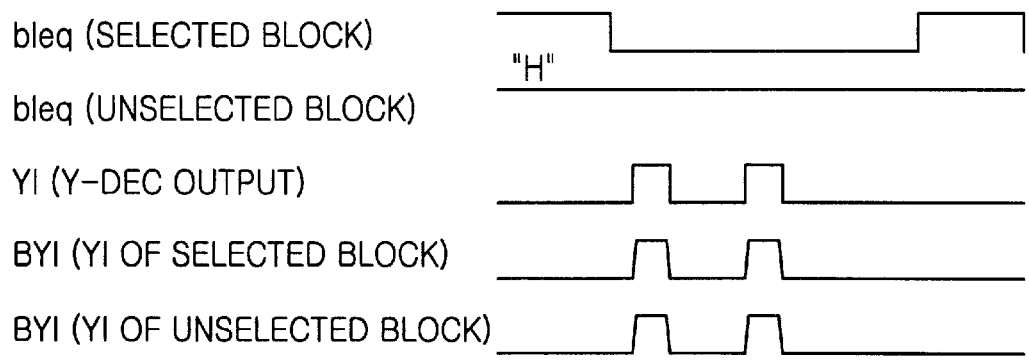
FIG. 3 shows a waveform of a column decoding apparatus as shown in FIG. 2.
Figure 4:
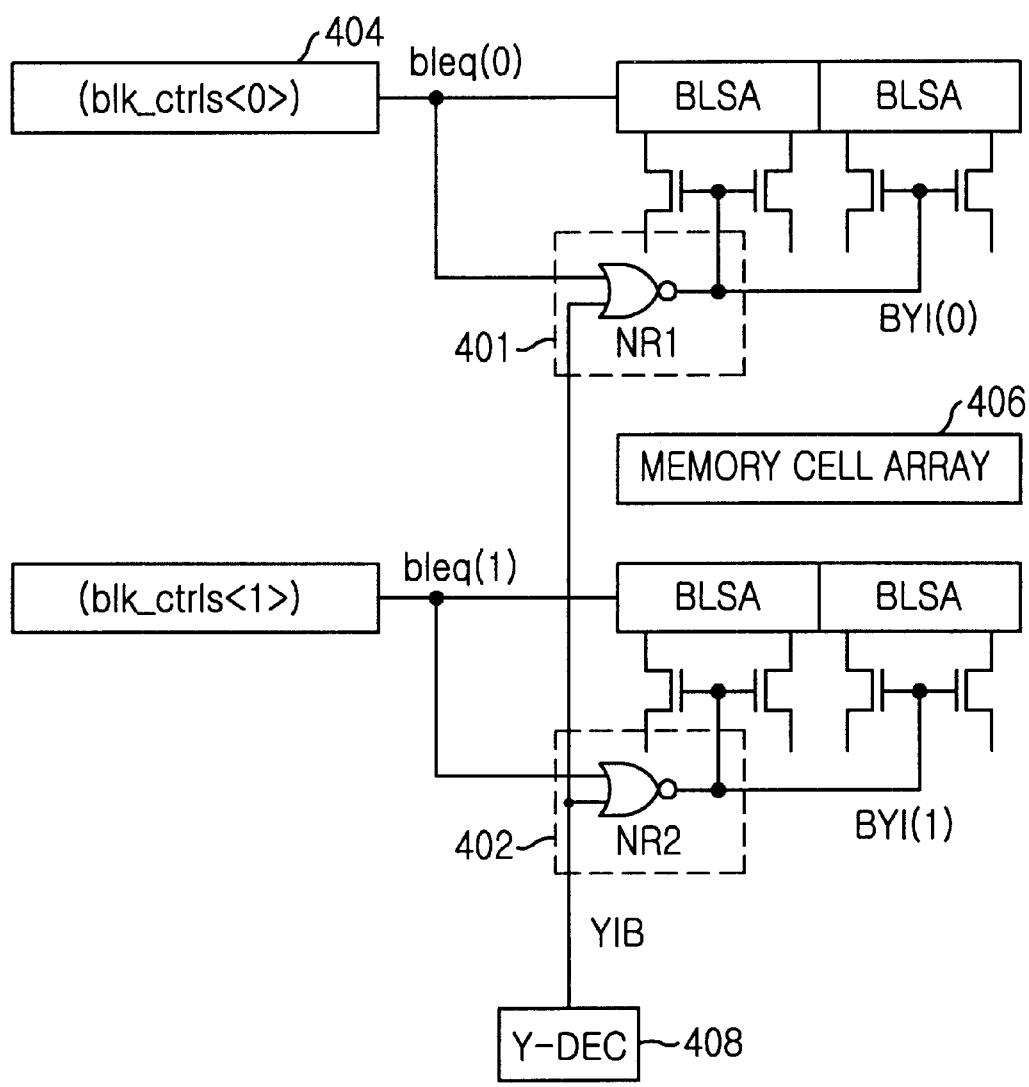
FIG. 4 is a block diagram of a column decoding apparatus according to a first embodiment of the present invention.
Figure 5:
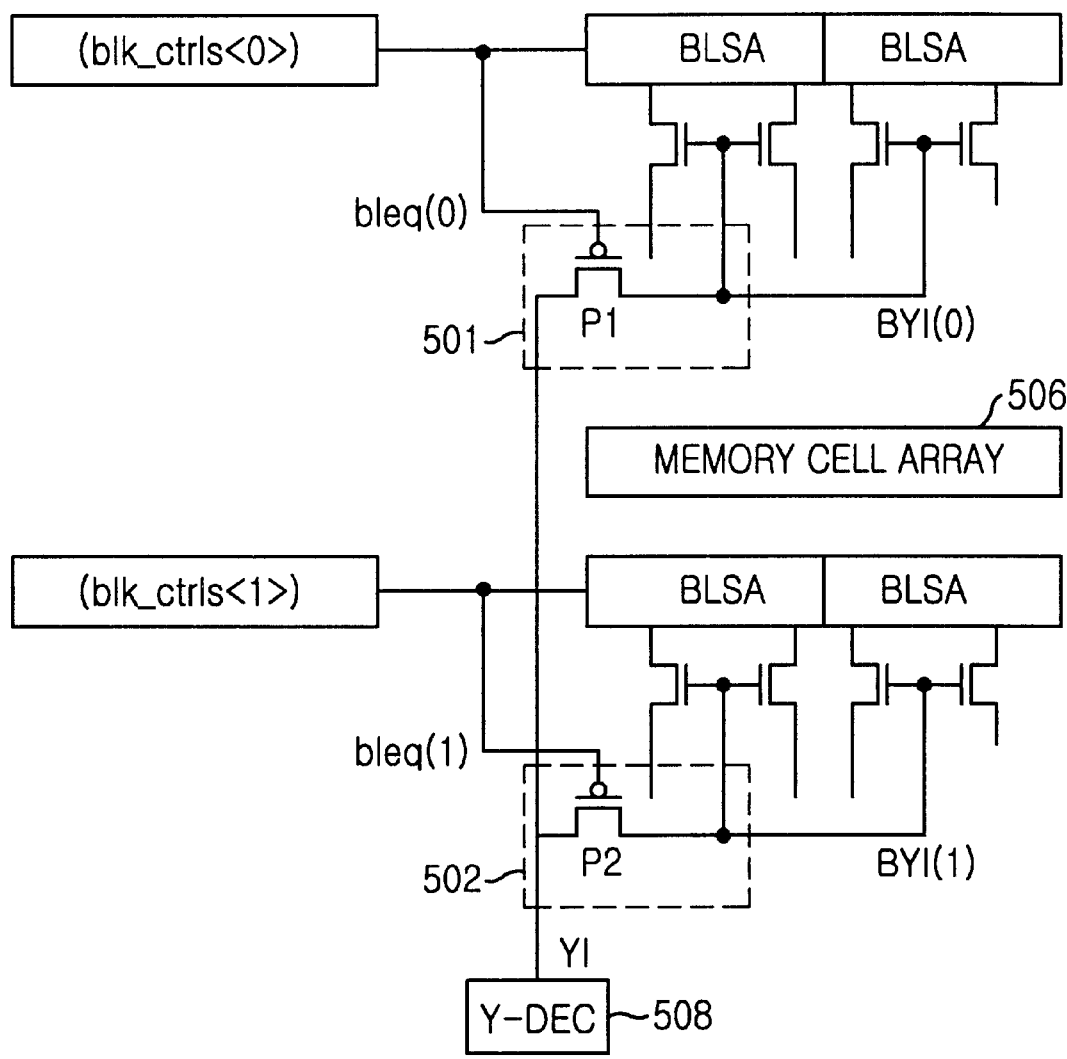
FIG. 5 is a block diagram of a column decoding apparatus according to a second embodiment of the present invention.
Figure 6:
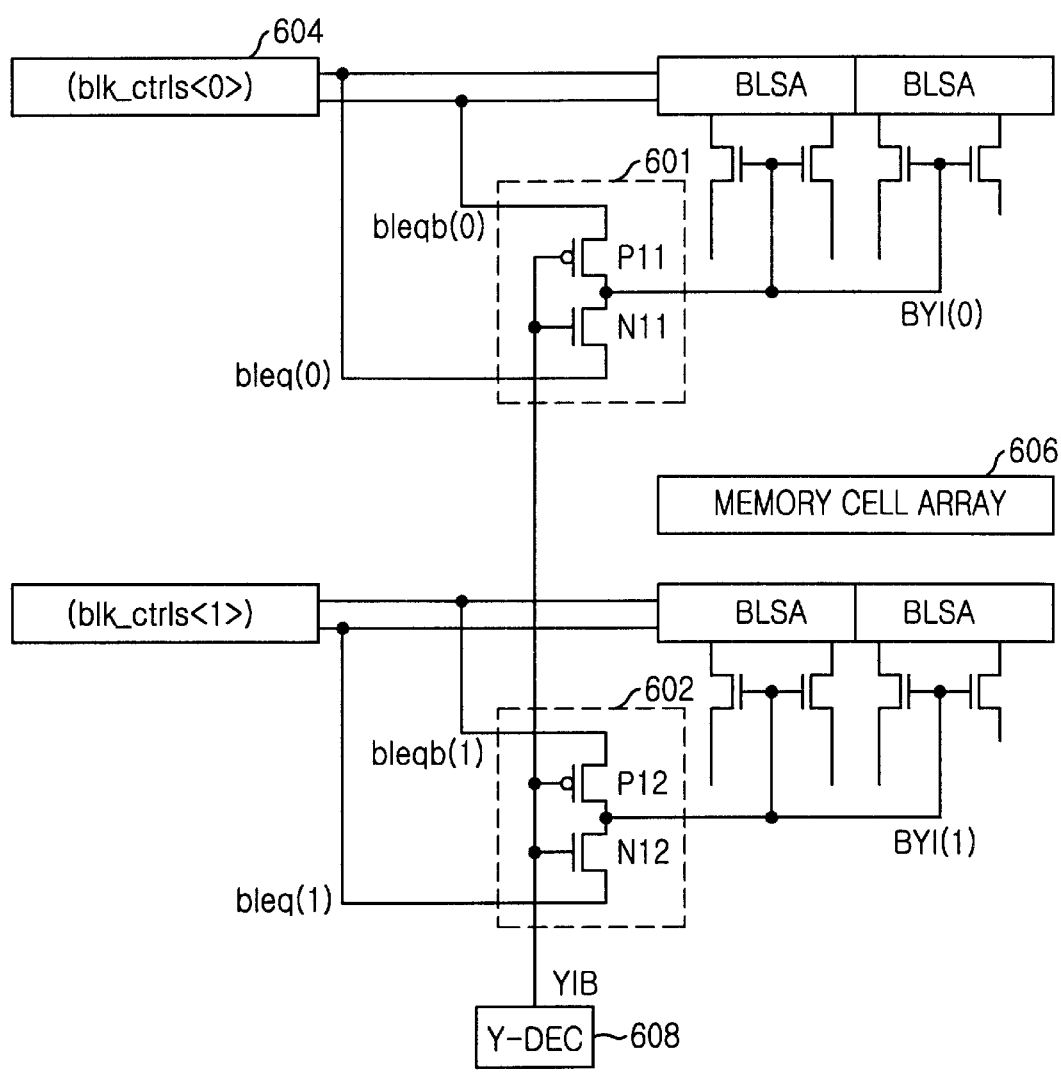
FIG. 6 is a block diagram of a column decoding apparatus according to a third embodiment of the present invention.

Each of the column decoding apparatuses shown in FIGS. 4 to 6 is the column decoding apparatus capable of reducing the transistor load of a column selecting signal by enabling the column selecting signal, i.e., the output of the Y-DEC, only for a block in which word lines are activated.

FIG. 4 shows a column decoding apparatus according to a first embodiment of the present invention, which uses NOR gates. The column decoding apparatus of FIG. 4 includes column selecting signal generators 401, 402 and driving transistors formed and residing (e.g., operably disposed and coupled) between the plurality of the bit line sense amplifier (BLSA) arrays and a data line associated with the memory cell array 406 by generating a column selecting signal BYI activated only within the block selected. BYI is activated by a bit line equalizing signal (bleq) that is a control signal of the block controlling unit and the output signal YIB of the column decoder Y-DEC 408. For example, block controlling unit 404 generates bleq(0).

The column selecting signal generators 401, 402 as described above include, respectively, NOR gates NR1, NR2, both receiving the bit line equalizing signal (bleq) of the respective block controlling unit and the output signal YIB of the column decoder Y-DEC 408.

The number of transistors connected to column decoder Y-DEC is thus reduced to, for example, 34 (2 NOR gates NR1, NR2×17 BLSA arrays), which is half the number used in a conventional column decoding apparatus.

Therefore, by reducing the load on the column decoder, output the rise/fall time of column selecting signal YI can be made faster. In addition, by preventing the degradation of a pulse through load reduction, read/write operations can be accurately executed.

FIG. 5 shows a column decoding apparatus according to a second embodiment of the present invention, which uses pass gates. The column decoding apparatus of FIG. 5 includes column selecting signal generators 501, 502 for the driving transistors formed between the plurality of BLSA arrays and a data line associated with a memory cell array 506 by generating the column selecting signal (BYI) activated only within the block selected by the output signal of the respective block controlling unit and the output signal YI of the column decoder Y-DEC 508.

Exemplary column selecting signal generators 501, 502 as described above include, respectively, PMOS transistors P1, P2, each having a gate coupled to the respective block controlling unit to receive a respective output signal, bleq and a drain coupled to the output of the column decoder Y-DEC 508.

Operation of column decoding as performed by the apparatus shown in FIG. 5 is described. For example, when output YI of column decoder Y-DEC 508 is activated, block column selecting signal BYI(0) is activated only when the bit line equalizing signal bleq(0) is low. When the bit line equalizing signal bleq(0) is high, the block column selecting signal BYI(0) remains disabled. At this point, the transistor load on column selecting signal YI is 17 (1 block×17 BLSA arrays), for example, which is a quarter of the load on a conventional column decoding apparatus.

Therefore, by reducing load on the column decoder, the rise/fall time of column selecting signal YI is decreased. Because load reduction prevents pulse degradation, read/write operations can be accurately executed.

A person having ordinary skill in the art should understand that the PMOS pass gate transistors could be replaced either with NMOS pass gate transistors, or with an NMOS pass gate transistor and a PMOS pass gate transistor.

FIG. 6 is a diagram of a column decoding apparatus according to a third embodiment of the present invention. Here, the column decoding apparatus includes column selecting signal generators 601, 602 for the driving transistors formed between the plurality of BLSA arrays and a data line associated with a memory cell array 606 by generating a column selecting signal BYI activated only within the block selected by the output signal of the block controlling unit and the output of the column decoder Y-DEC 608.

Column selecting signal generators 601, 602 as described above include, respectively, PMOS transistor P11 and NMOS transistor N11, and PMOS transistor P12 and a NMOS transistor N12. Each of the PMOS transistors P11, P12 has a source coupled to the inverted output of the block controlling unit and a gate coupled to the output of the column decoder Y-DEC 608, and each of the NMOS transistors N11, N12 has a source coupled to the output of the respective block controlling unit and a gate coupled to receive YIB from the output of the column decoder Y-DEC 608.

For example, the column decoding apparatus of FIG. 6 uses a bit line equalizing signal bleq(0) and a bit line equalizing bar signal bleqb(0) signal generated at the block generating unit 604.

In operation, a power voltage (Vcc) is applied to exemplary generator 601 as the bleqb(0) signal and a ground voltage (Vss) is applied as the bleq(0) signal. The output signal YIB of the column decoder Y-DEC 608 is used as the input generator 601, where generator 601 resides within the selected block, so that only column selecting signal BYI(0) within the selected block is activated. Each column selecting generator thus operates as a selectable inverter under control of signals belqb and bleq. YIB is the input to such an inverter.

At this point, the transistor load connected to the output of column decoder Y-DEC is 34, for example, (2 blocks×17 BLSA arrays), which is half the number used by a conventional column decoding apparatus.

Figure 7:
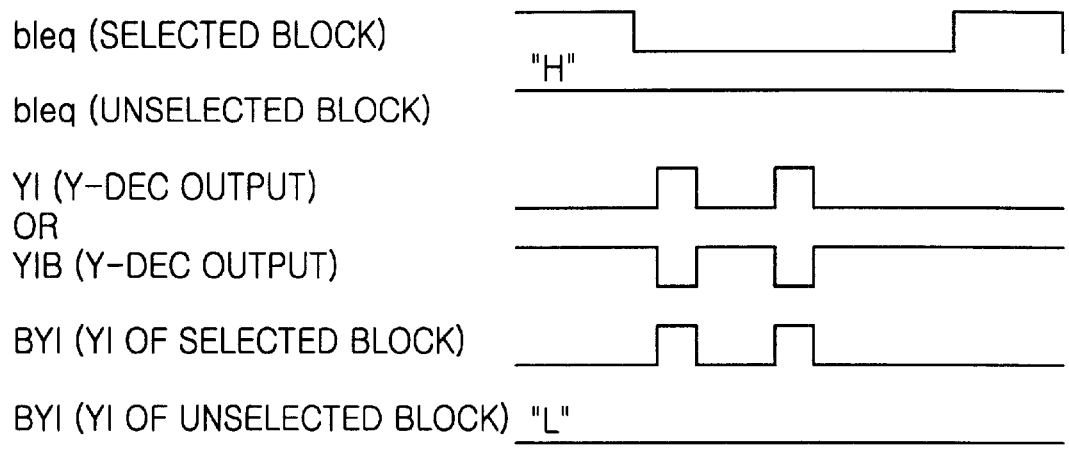
FIG. 7 shows a waveform of a column decoding apparatus of the present invention.

FIG. 7 shows the waveform of the column decoding apparatus of the present invention that shows how the integrity of the pulsed column selecting signal is prevented from degrading and reduced rise/fall time of the column selecting signal.

As described above, decoding a column address in a unit of a block, decreases the load on the column selecting signal to a load less than that of conventional global column decoding devices, thereby reducing the rise/fall time of the column selecting signal. This results in faster execution of read/write operations. Furthermore, pulse degradation of the column selecting signal is prevented and read/write operations may be accurately executed.

Although the present invention has been shown and described with respect to the particular embodiments, it will be apparent to those skilled in the art that many variations and modifications may be made without departing from the spirit and scope of the invention as defined in the appended claims.

What is claimed is:

1. A column decoding apparatus for use in a semiconductor memory device having a plurality of memory cell arrays, where at least one of the memory cell arrays is coupled to one or more bit line sense amplifier arrays, a column decoder, and at least one column driving transistor, wherein the at least one column driving transistor is coupled between the one or more bit line sense amplifier arrays and a data line, the column decoding apparatus comprising:

block controlling means, coupled to a corresponding one of the bit line sense amplifier arrays, for providing a bit line equalizing signal;

column selecting signal generating means for receiving the bit line equalizing signal and an output signal from the column decoder and generating a column selecting signal to activate the column driving transistor connected to the corresponding bit line sense amplifier array; and a memory cell array selected by the block controlling means, wherein the column selecting signal is activated within only the selected memory cell array.

2. The apparatus as recited in claim 1, wherein the column selecting signal generating means includes:

a logic circuit for producing the column selecting signal by using the bit line equalizing signal and the output signal.

3. The apparatus as recited in claim 2, wherein the logic circuit is a NOR gate.

4. The apparatus as recited in claim 1, wherein the column selecting signal generating means includes:

at least one transistor, the transistor having a gate coupled to the bit line equalizing signal of the block controlling means and a drain coupled to the output signal of the column decoder.

5. The apparatus as recited in claim 1, wherein the column selecting signal generating means includes:

a first transistor having a source coupled to an inverted bit line equalizing signal and a gate coupled to the output signal of the column decoder; and a second transistor having a source coupled to the bit line equalizing signal and a gate coupled to the output signal of the column decoder.

6. The apparatus as recited in claim 5, wherein the first and the second transistors include a PMOS transistor serially coupled to an NMOS transistor.

* * * * *